United States Patent
Yamamoto

[11] Patent Number: 5,729,170
[45] Date of Patent: Mar. 17, 1998

[54] FREQUENCY DIVIDER

[75] Inventor: Kazuya Yamamoto, Itami, Japan

[73] Assignee: Mitsubishi Denki Kabushiki Kaisha, Tokyo, Japan

[21] Appl. No.: 987,700

[22] Filed: Dec. 9, 1992

[30] Foreign Application Priority Data

May 28, 1992 [JP] Japan .................... 4-164232

[51] Int. Cl.$^6$ ................ H03K 5/00; H03K 21/02
[52] U.S. Cl. ............... 327/379; 327/556; 327/558; 327/311; 327/320; 327/532; 327/117; 377/47
[58] Field of Search ............... 327/379, 108, 327/551, 311, 313, 320, 556, 552, 558, 115, 117, 384; 377/47, 48

[56] References Cited

U.S. PATENT DOCUMENTS

| | | | |
|---|---|---|---|
| 4,315,165 | 2/1982 | Shimizu | 307/299.3 |
| 4,438,405 | 3/1984 | Yazawa et al. | 328/137 |
| 4,633,520 | 12/1986 | Okazaki | 307/520 |
| 4,638,180 | 1/1987 | Sagawa et al. | 377/47 |
| 4,679,003 | 7/1987 | Sagawa et al. | 307/219.1 |
| 4,734,596 | 3/1988 | Cambell et al. | 328/162 |
| 4,749,951 | 6/1988 | Tanaka | 307/520 |
| 5,130,579 | 7/1992 | Thomas | 328/162 |
| 5,214,681 | 5/1993 | Satoh | 377/47 |

FOREIGN PATENT DOCUMENTS

| | | | |
|---|---|---|---|
| 496362 | 7/1968 | Germany . | |
| 0042521 | 2/1988 | Japan | 307/551 |
| 2021723 | 7/1988 | Japan . | |
| 327624 | 2/1991 | Japan . | |
| 0862426 | 3/1961 | United Kingdom . | |
| 1214605 | 12/1970 | United Kingdom . | |
| 2196497 | 2/1987 | United Kingdom . | |
| 9115056 | 10/1990 | WIPO . | |

OTHER PUBLICATIONS

Maemura et al., "A 1GHz–2mA/5V GaAs 128/129 Prescaler IC", Proceedings of the IEEE GaAs IC—Gallium Arsenide Integrated Circuit Symposium, Oct. 1987, pp. 273–276.

*Primary Examiner*—Timothy P. Callahan
*Assistant Examiner*—Dinh T. Le
*Attorney, Agent, or Firm*—Leydig, Voit & Mayer, Ltd.

[57] ABSTRACT

An input buffer circuit for a frequency divider includes a bias circuit including a first group of diodes connected in series and to a power supply voltage terminal, at least first and second resistors connected in series to each other at a first junction, the first resistor being connected in series with the first plurality of diodes, and a second plurality of diodes connected in series, the second plurality of diodes being connected between the second resistor and a ground; an input signal terminal for receiving an input signal from a frequency divider; a reference input terminal for receiving a reference signal; an output signal terminal; a reference output terminal connected to the reference input terminal; an amplitude limiting circuit connected to and between the output signal terminal and the reference output terminal; third and fourth resistors connected in series to each other at a second junction, the third resistor being connected to the output signal terminal and the fourth resistor being connected to the reference output terminal, the first and second junctions being connected together; and a capacitor connecting the first and second junctions to ground.

11 Claims, 11 Drawing Sheets

(Prior Art)

Fig. 11

(Prior Art)

Fig. 12

( Prior Art )

FREQUENCY DIVIDER

FIELD OF THE INVENTION

The present invention relates to frequency dividers used for frequency synthesizers or the like and, more particularly to prescalers.

BACKGROUND OF THE INVENTION

Frequency synthesizers have been used widely in various kinds of communication systems. For example, when a frequency synthesizer is included in a mobile telephone transceiver, the frequency synthesizer varies the frequency of the local oscillation signal which is input to receiver and transmitter mixers for channel switching.

When such a frequency synthesizer is constituted, a prescaler serves as a pre-frequency-divider for dividing the oscillation frequency of a voltage controlled oscillator (hereinafter referred to as VCO) to produce a frequency at which a programmable counter used as a variable divider comprising conventional CMOS operates. The prescaler includes an internal logic circuit which divides an input signal and an input buffer circuit which receives an output signal from the VCO and provides an input signal to the internal logic circuit.

Figure 10:
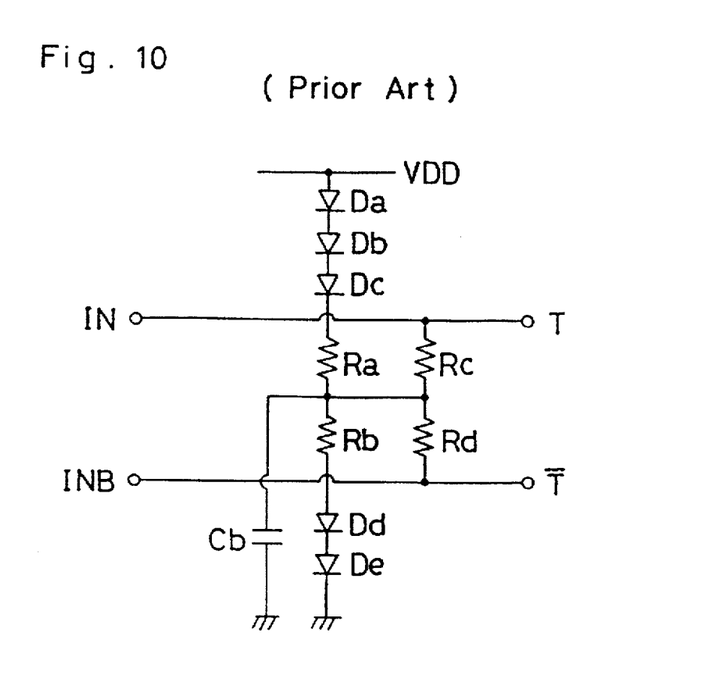
FIG. 10 is a diagram illustrating an input buffer circuit of a prescaler comprising passive elements in accordance with the prior art.
Figure 11:
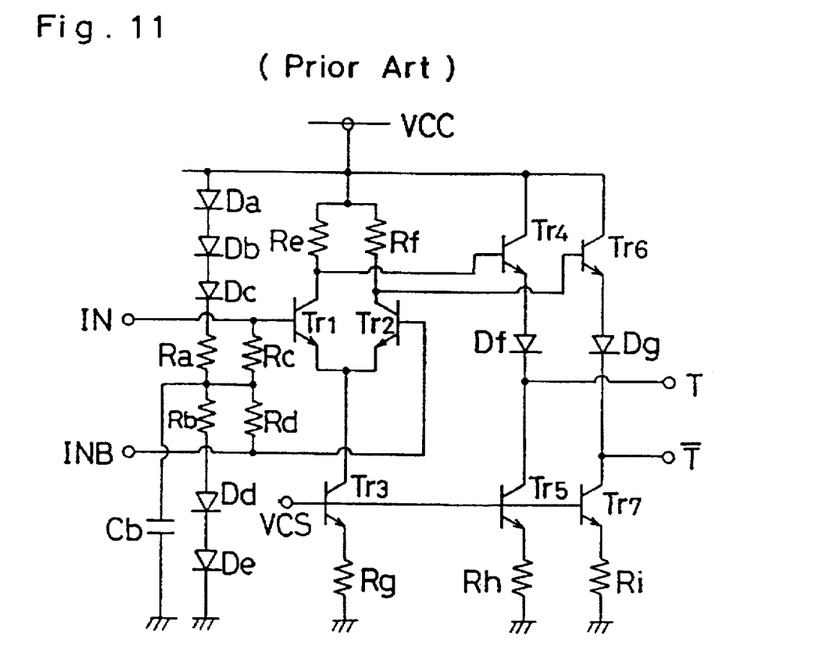
FIG. 11 is a diagram illustrating an input buffer circuit of a prescaler comprising active elements in accordance with the prior art.

FIGS. 10 and 11 are diagrams illustrating input buffer circuits used in conventional prescalers, in which FIG. 10 shows a circuit comprising passive elements and FIG. 11 shows a circuit comprising active elements.

In FIG. 10, diodes Da to De are serially connected between a power supply terminal VDD and the ground. Resistors Ra and Rb are serially connected between the diodes Dc and Dd. Resistors Rc and Rd are serially connected between an input signal terminal IN and a reference signal terminal INB. The junction of the resistors Rc and Rd and the junction node of the resistors Ra and Rb are connected to each other and grounded through a capacitor Cb. Reference characters T and $\bar{T}$ designate output signal terminals.

In FIG. 11, diodes Da to De are serially connected between a power supply terminal VCC and the ground. Resistors Ra and Rb are serially connected between the diodes Dc and Dd. Resistors Rc and Rd are serially connected between an input signal terminal IN and a reference signal terminal INB. The junction of the resistors Rc and Rd and the junction of the resistors Ra and Rb are connected to each other and grounded through a capacitor Cb. The input signal terminal IN is connected to a base of a transistor Tr1 and the reference signal terminal INB is connected to a base of the transistor Tr2. Collectors of the transistors Tr1 and Tr2 are connected to the power supply terminal VCC through the resistors Re and Rf, respectively. Emitters of the transistors Tr1 and Tr2 are connected to each other and grounded through the transistor Tr3 and the resistor Rg. The junction of the resistor Re and the collector of the transistor Tr1 is connected to a base of the transistor Tr4. A collector of the transistor Tr4 is connected to the power supply terminal VCC and an emitter thereof is grounded through a diode Df, a transistor Tr5, and a resistor Rh. The junction node of the resistor Rf and the collector of the transistor Tr2 is connected to a base of a transistor Tr6. A collector of the transistor Tr6 is connected to the power supply terminal VCC and an emitter thereof is grounded through a diode Dg, a transistor Tr7, and a resistor Ri. Bases of the transistors Tr3, Tr5, and Tr7 are connected to a constant current source bias terminal VCS. In this input buffer circuit, the junction of the diode Df and the collector of the transistor Tr5 serves as an output signal terminal T and the junction of the diode Dg and the collector of the transistor Tr7 serves as an output signal terminal $\bar{T}$.

In the input buffer circuits of FIGS. 10 and 11, the diodes Da to De, the resistors Ra to Rd, and the capacitor Cb constitute a bias circuit.

Figure 12:
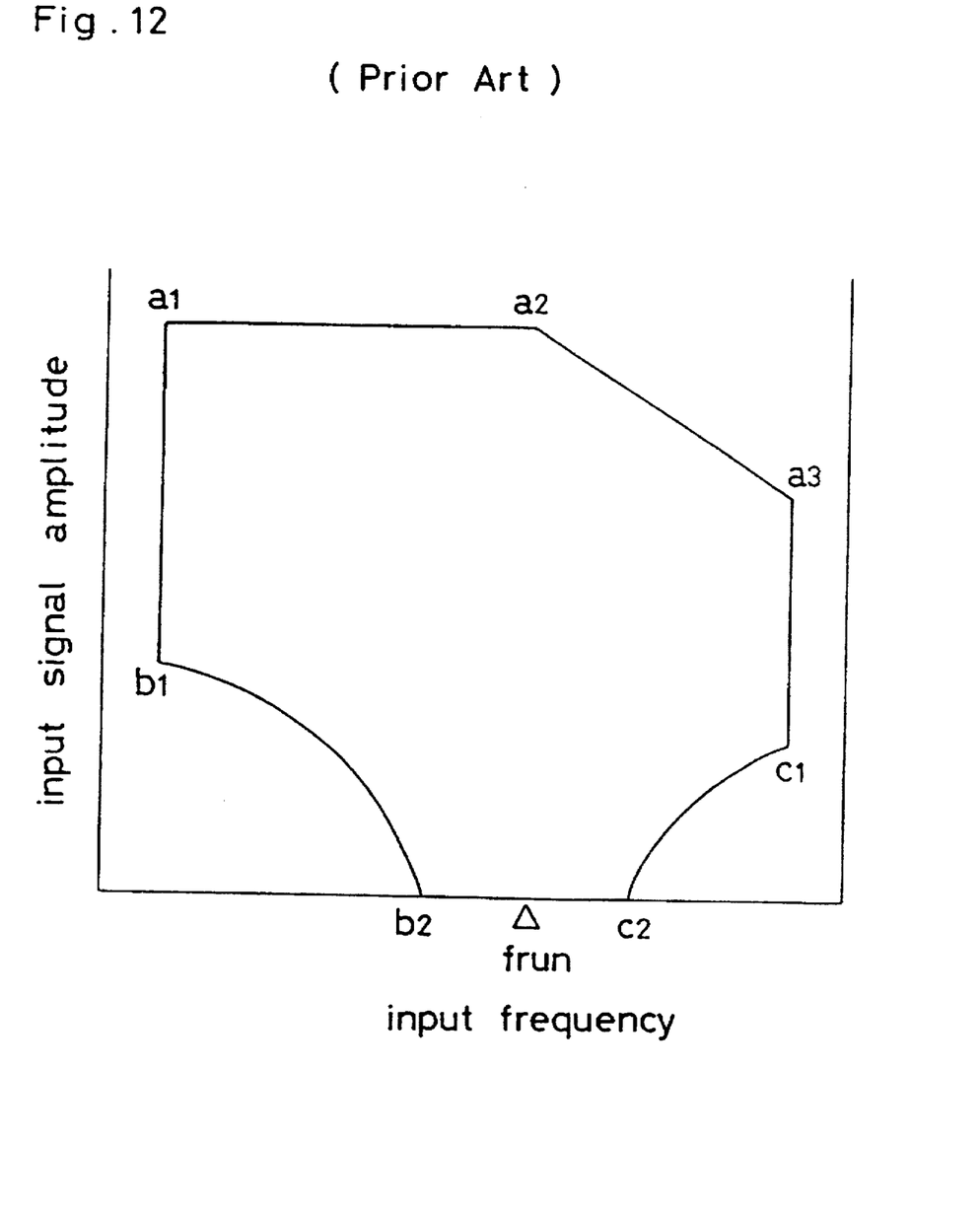
FIG. 12 is a diagram illustrating input sensitivity characteristics of the input buffer circuit comprising passive elements in accordance with the prior art.

FIG. 12 is a graph illustrating input signal amplitude vs. input frequency characteristics of a prescaler with the input buffer circuit shown in FIG. 10. In FIG. 12, a curve a1-a2-a3 indicates a maximum input sensitivity level, curves b1-b2 and c1-c2 indicate minimum input sensitivity levels, and $f_{run}$ indicates a self-running oscillation frequency of the prescaler.

As described above, the prescaler divides an output from the VCO which operates in a wide voltage range and a wide frequency range before it is input to the variable divider, so that a high-speed operation in a wide range of input signal amplitude and a wide frequency range is required of the prescaler.

When the prescaler is constituted by a silicon (Si) IC, the internal logic circuit performing the dividing operation is usually emitter coupled logic (ECL). Alternatively, in case where the prescaler is constituted by a gallium arsenide (GaAs) IC, the internal logic circuit is usually a source coupled FET logic (SCFL). In these cases, one of the outputs T and $\bar{T}$ from the input buffer circuit of the prescaler is a signal input to the internal circuit while the other is a reference. Alternatively, the outputs T and $\bar{T}$ have opposite phases.

In the input buffer circuits shown in FIGS. 10 and 11, a signal is input to the signal input terminal IN by capacitive coupling while the reference input terminal INB is AC grounded by the capacitance, whereby the above-described operation is achieved. In the input buffer circuit of FIG. 10, the internal circuit is directly driven by the input signal. On the other hand, in the input buffer circuit of FIG. 11, the input amplitude is converted into a voltage difference in the resistors Re and Rf and the transistors Tr4 and Tr6 drive the internal circuit using the amplitude.

In the prescaler including the input buffer of FIG. 10 which drives the internal circuit with the input signal, the input sensitivity of the prescaler within the operating frequency limits is restricted by a faulty dividing operation caused by self-running oscillation of the prescaler in a low frequency region and by a faulty dividing operation caused by a gate delay of the internal circuit in a high frequency region, resulting in input sensitivity characteristics shown in FIG. 12. At this time, the minimum input sensitivity is highest in the vicinity of the self-running oscillation frequency $f_{run}$, i.e., in the vicinity of b2 and c2, and the maximum input sensitivity reduces with increasing frequency in the high frequency region as shown by a line a2–a3.

Generally, the input sensitivity performance of a prescaler is determined by how wide the range of input signal amplitude is divided in a wide frequency range, so that a reduction in the maximum input sensitivity in the high frequency region causes a reduction in the input sensitivity performance of the prescaler in the high frequency region.

This problem can be solved by driving the internal circuit with an input signal level restricted within prescribed limits by the input buffer. However, when the input buffer comprises active elements as shown in FIG. 11, since the input buffer has to drive the internal circuit by itself, power consumption in the input buffer unfavorably increases, resulting in an increase in the power consumption of the whole prescaler IC.

SUMMARY OF THE INVENTION

It is an object of the present invention to improve the input sensitivity performance of a prescaler by preventing a reduction in maximum input sensitivity of the prescaler in the high frequency region and by reducing deterioration in minimum input sensitivity without an increase in power consumption in the input buffer.

Other objects and advantages of the present invention will become apparent from the detailed description given hereinafter; it should be understood, however, that the detailed description and specific embodiment are given by way of illustration only, since various changes and modifications within the spirit and the scope of the invention will become apparent to those skilled in the art from this detailed description.

According to an aspect of the present invention, a frequency divider includes an amplitude limiter in its input stage. The amplitude limiter operates to limit the voltage amplitude of a signal input to a divider stage in a prescribed frequency range within an operating frequency region of the divider stage. Therefore, input sensitivity performance of the frequency divider is improved.

DETAILED DESCRIPTION OF THE PREFERRED EMBODIMENTS

Figure 1:
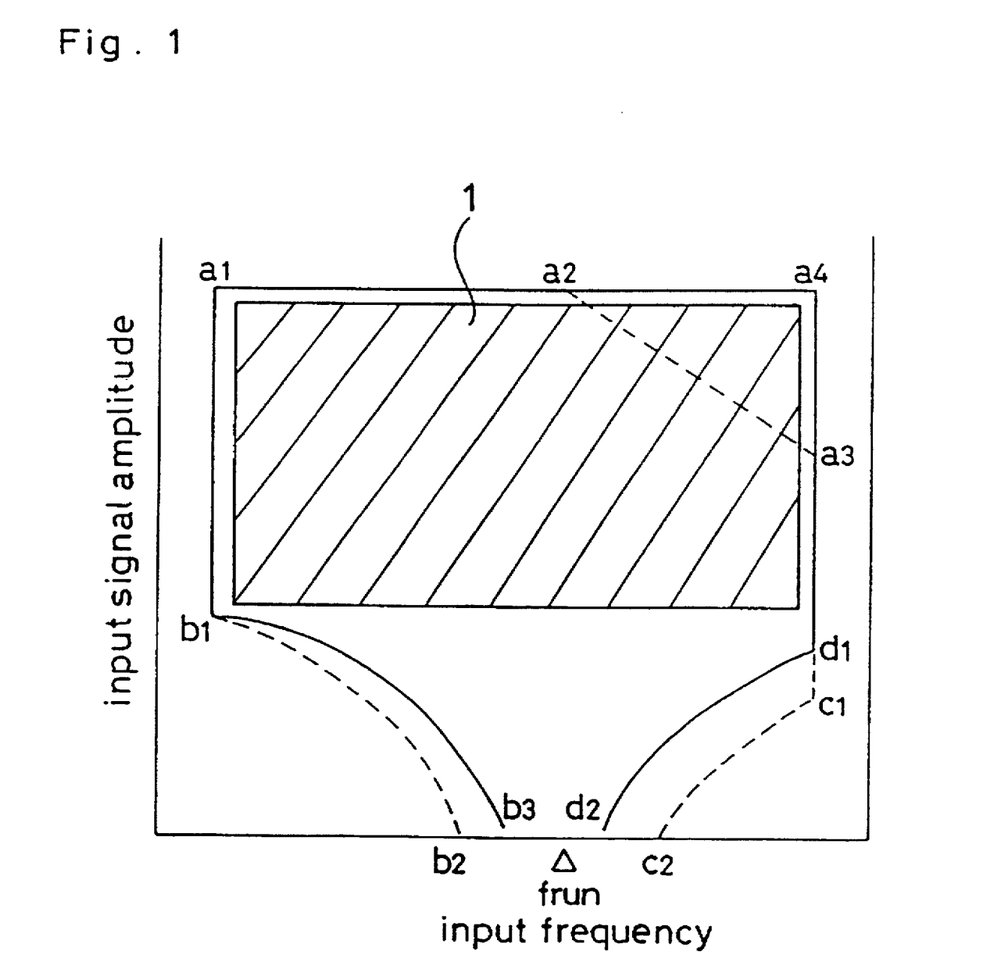
FIG. 1 is a diagram illustrating typical input sensitivity characteristics of a frequency divider in accordance with an embodiment of the present invention.

FIG. 1 is a diagram illustrating typical input sensitivity characteristics of a prescaler including an input buffer with a filter, according to an embodiment of the present invention. In FIG. 1, a line a1-a2-a4 indicates a maximum input level of a prescaler including an input buffer with the amplitude limiting means of the present invention, and curves b1–b3 and d1–d2 indicate the minimum input sensitivity levels thereof. In addition, a line a1-a2-a3 indicates the maximum input sensitivity level of the conventional prescaler with no input limiting means, and curves b1–b2 and c1–c2 indicate the minimum input sensitivity levels thereof.

Figure 2A:
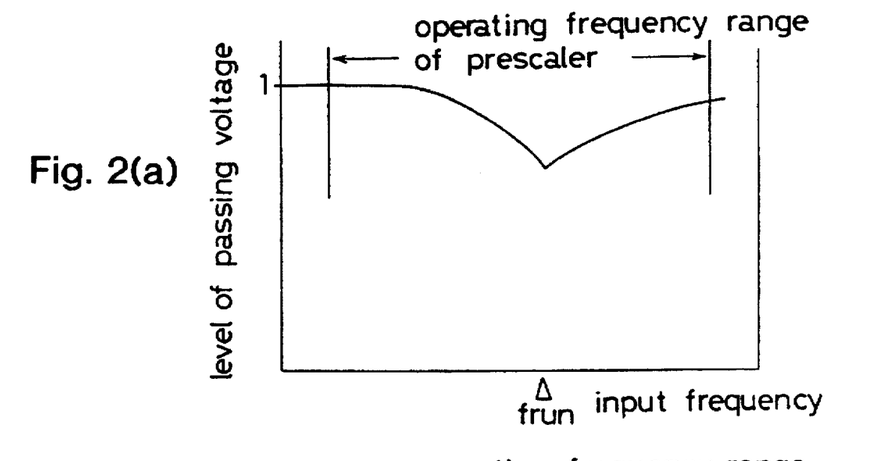
FIGS. 2(a)–2(c) are diagrams illustrating filter characteristics needed for obtaining the input sensitivity characteristics shown in FIG. 1.
Figure 2B:
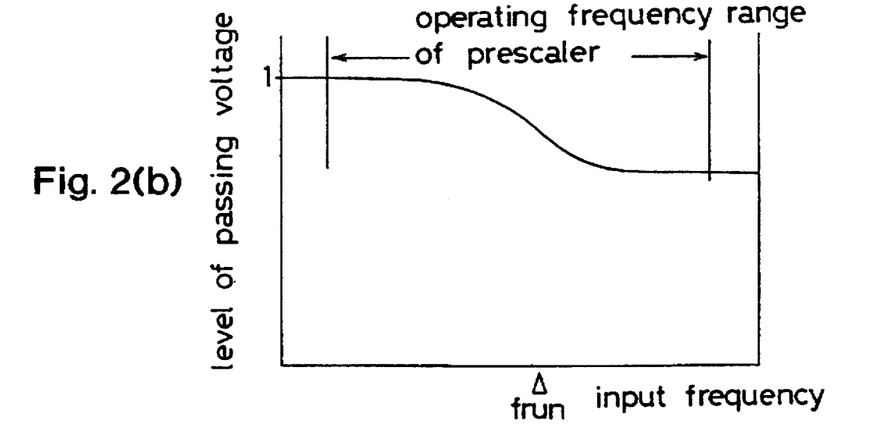
Figure 2C:
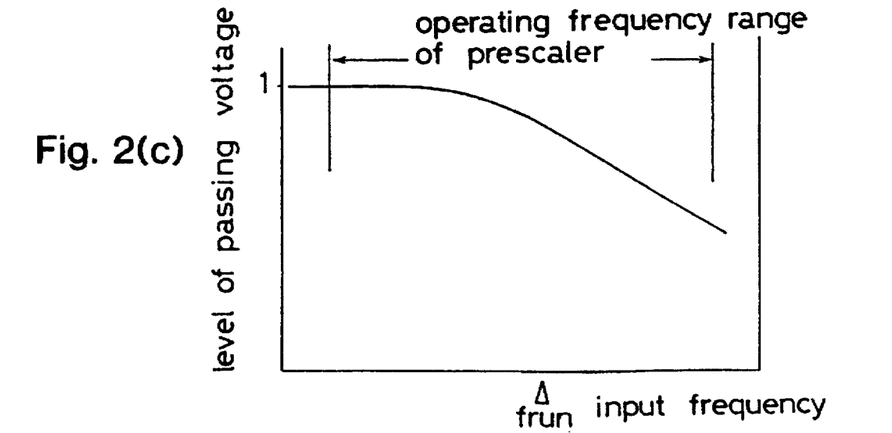

FIGS. 2(a)–2(c) illustrate characteristics of the amplitude limiting means needed for obtaining the input sensitivity characteristics of FIG. 1, i.e., characteristics of filters included in the input buffer, in which FIG. 2(a) shows a band-rejection characteristic and FIGS. 2(b) and 2(c) show low-pass characteristics. In the figures, the input voltage level is 1.

Figure 3A:
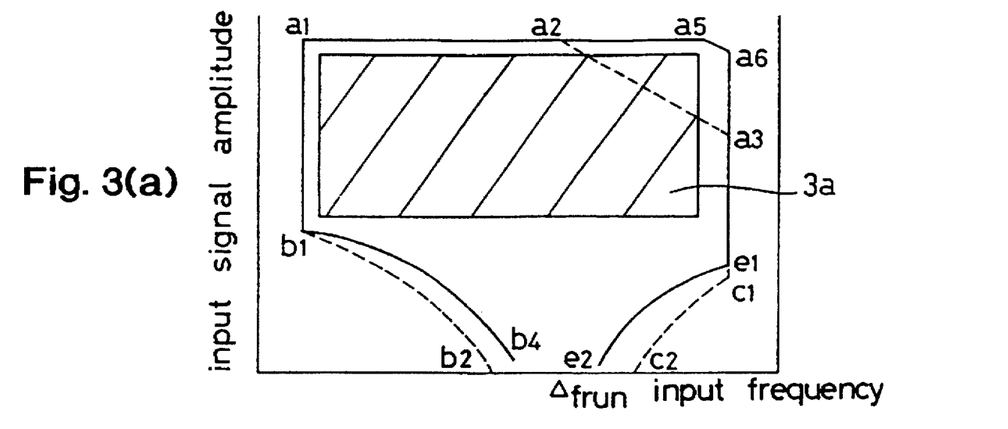
FIGS. 3(a)–3(c) are diagrams illustrating input sensitivity characteristics of prescalers including input buffers with the filter characteristics shown in FIGS. 2(a)–2(c), respectively.
Figure 3B:
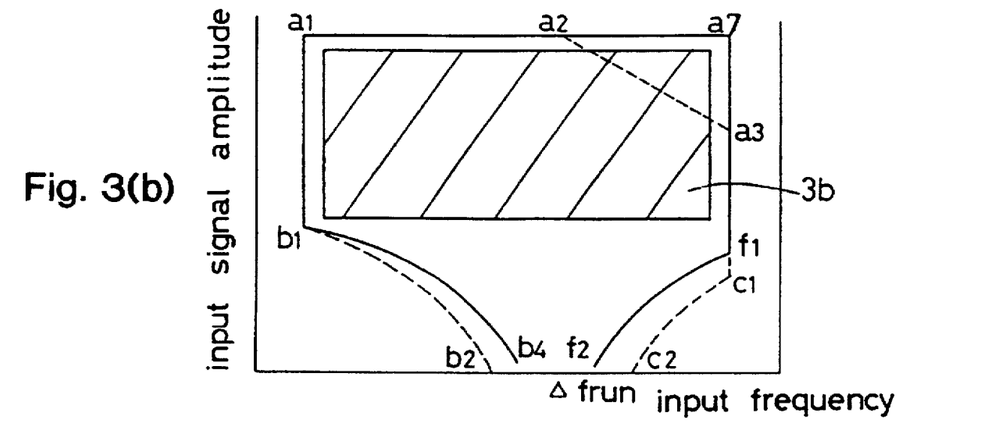
Figure 3C:
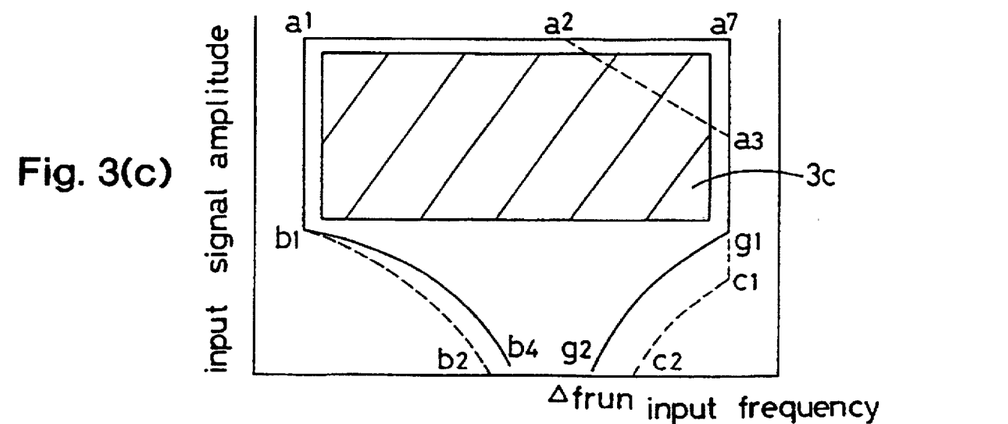

FIGS. 3(a)–3(c) are diagrams illustrating input sensitivity characteristics of prescalers including input buffers with filters having the characteristics shown in FIGS. 2(a)–2(c), respectively. In FIG. 3(a), a line a1-a2-a5-a6 indicates the maximum input sensitivity level of a prescaler including an input buffer with a filter having the characteristic of FIG. 2(a), and curves b1–b4 and e1–e2 indicate the minimum input sensitivity level thereof. In addition, in FIG. 3(b), a line a1-a2-a7 indicates the maximum input sensitivity level of a prescaler including an input buffer with a filter having the characteristic of FIG. 2(b), and curves b1–b4 and f1–f2 indicate the minimum input sensitivity level thereof. In addition, in FIG. 3(c), a line a1-a2-a7 indicates the maximum input sensitivity level of a prescaler including an input buffer with a filter having the characteristic of FIG. 2(c), and curves b1–b4 and g1–g2 indicate the minimum input sensitivity level thereof.

When the filter characteristics shown in FIGS. 2(a)–2(c) are adjusted to input sensitivity characteristics as described in the following, the maximum input sensitivity in the high frequency region increases, and deterioration in the minimum input sensitivity in the low frequency region is minimized because the minimum input sensitivity restricts the input signal passing level in a frequency region in the vicinity of the self-running oscillation frequency $f_{run}$ or a frequency region higher than that. Accordingly, the hatched region 1 in FIG. 1 (or hatched regions 3a–3c in FIGS. 3(a)–3(c)) is extended, so that the prescaler operates with input signals in a wide and constant range in a wide frequency region, thereby improving the input sensitivity of the prescaler IC.

Concrete examples of the input buffer circuits having the filter characteristics shown in FIGS. 2(a)–2(c) will be described. In the description, each filter is constituted by resistors and capacitors without using inductors to reduce the size of the IC chip.

Figure 4A:
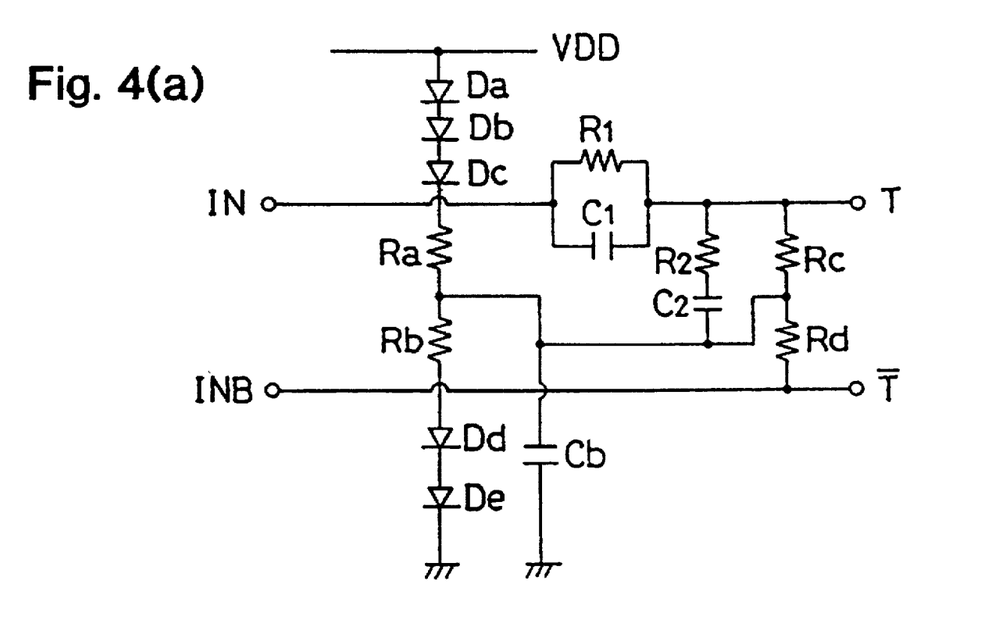
FIGS. 4(a) and 4(b) are diagrams illustrating an input buffer circuit including a filter with the band-rejection characteristic of FIG. 2(a)

FIG. 4(a) is a diagram illustrating an input buffer circuit of a frequency divider in accordance with a first embodiment of the present invention. In this embodiment, a filter having the band-rejection characteristic of FIG. 2(a) is included in the input buffer circuit. In FIG. 4(a), resistors R1 and R2 and capacitors C1 and C2 comprise the band-rejection filter.

When a center frequency of the band-rejection filter is set in the vicinity of the self-running oscillation frequency $f_{run}$ and the amount of damping at the peak is suppressed while considering the operating frequency band of the prescaler, the input signal levels in a frequency region in the vicinity of the self-running oscillation frequency $f_{run}$ and in the high frequency region are restricted and input to the internal circuit, whereby the maximum input sensitivity in the high frequency region increases. In addition, since the amount of decrease in the input signal level reaches a maximum in the vicinity of the self-running oscillation frequency $f_{run}$ where the input sensitivity of the prescaler is highest, the reduction in the minimum input sensitivity is minimized. Thus, the input sensitivity characteristics shown in FIG. 3(a) are obtained.

Figure 4B:
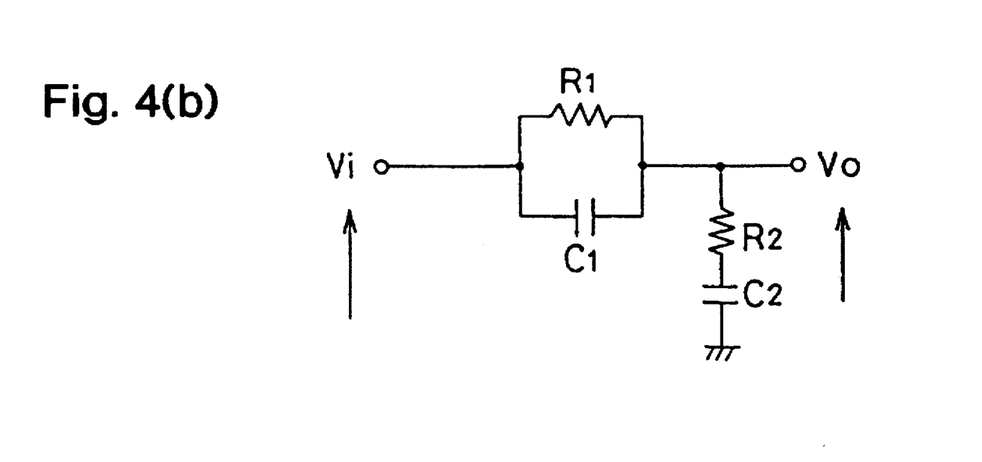

A description is given of a method of determining the values of resistors R1 and R2 and the capacitors C1 and C2 of the band-rejection filter included in the input buffer circuit of FIG. 4(a). FIG. 4(b) illustrates an AC equivalent circuit of the band-rejection filter. In FIG. 4(a), a capacitor Cb is AC grounded. Resistors Ra, Rb, Rc, and Rd shown in FIG. 4(a) are omitted in FIG. 4(b) because these resistors are significantly larger than other resistors.

The relation between an input Vi and an output Vo is represented as follows by a complex vector indication.

$$\frac{Vo}{Vi} = \frac{1 - \omega^2 C1C2R1R2 + j\omega(C1R1 + C2R2)}{1 - \omega^2 C1C2R1R2 + j\omega(C1R1 + C2R2 + C2R1)} \quad (1)$$

The frequency fo, at which Vo is lowest in the formula (1), is approximately as follows.

$$fo = \frac{1}{2\pi \sqrt{C1\,C2\,R1\,R2}} \quad (2)$$

Therefore, when the input frequency is fo, the Vo/Vi is represented as follows.

$$\frac{Vo}{Vi} = \frac{C1R1 + C2R2}{C1R1 + C2R2 + C2R1} \quad (3)$$

In order to set the damping of the prescaler in the vicinity of $f_{run}$ so that it may reach a maximum when Vo/Vi is approximately 0.6, the values of the resistors R1 and R2 and the capacitors C1 and C2 should be determined so that the frequency fo in the formula (2) is approximately equal to the self-running oscillation frequency $f_{run}$ of the prescaler and the Vo/Vi in the formula (3) is 0.6. In a practical design, each constant value is set to an optimum value by a circuit simulation on the basis of the above-described guideline while considering conditions in the design process.

Figure 5A:
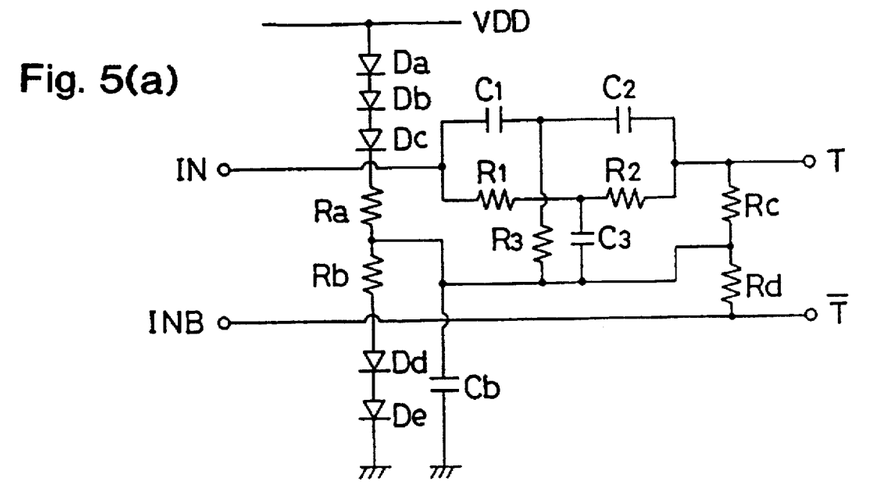
FIGS. 5(a)–5(c) are diagrams illustrating an input buffer circuit including a notch-filter with the band-rejection characteristic of FIG. 2(a)

FIG. 5(a) is a diagram illustrating an input buffer circuit of a frequency divider in accordance with a second embodiment of the present invention. In this second embodiment, the input buffer circuit includes a notch filter with the band-rejection characteristic shown in FIG. 2(a). In FIG. 5(a), resistors R1 to R3 and capacitors C1 to C3 comprise the notch filter.

When the center frequency of the notch filter is set in the vicinity of the self-running oscillation frequency $f_{run}$ and the amount of damping at the peak is suppressed while considering the operating frequency band of the prescaler, the input signal levels in a frequency region in the vicinity of the self-running oscillation frequency $f_{run}$ and in the high frequency region are restricted and input to the internal circuit, whereby the maximum input sensitivity level in the high frequency region increases. In addition, since the decrease in the input signal level reaches a maximum in the vicinity of the self-running oscillation frequency $f_{run}$ where the input sensitivity of the prescaler is highest, deterioration in the minimum input sensitivity is minimized. Thus, the input sensitivity characteristics shown in FIG. 3(a) are obtained.

Figure 5B:
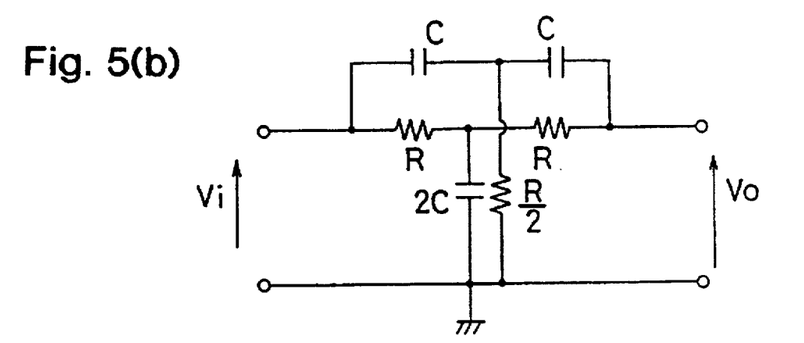

A description is given of a method of determining the values of the resistors R1, R2, and R3 and the capacitors C1, C2, and C2 of the notch filter included in the input buffer circuit of FIG. 5(a). The notch filter is also called a twin T-type circuit, and FIG. 5(b) illustrates an AC equivalent circuit thereof. In FIG. 5(b), the constants R1, R2, R3, C1, C2, and C3 of FIG. 5(a) are made Ri=R2=R, R3=R/2, Ci=C2=C, and C3=2C. In addition, the capacitor Cb is AC grounded and resistors Ra, Rb, Rc, and Rd shown in FIG. 5(a) are omitted in FIG. 5(b) because these resistors are significantly larger than other resistors.

The relation between an input Vi and an output Vo is represented as follows.

$$\frac{Vo}{Vi} = \frac{1}{1 + j4 \dfrac{\dfrac{\omega}{\omega_o}}{1 - \left[\dfrac{\omega}{\omega_o}\right]^2}} \quad (4)$$

where $\omega_o = 1/CR$.

Figure 5C:
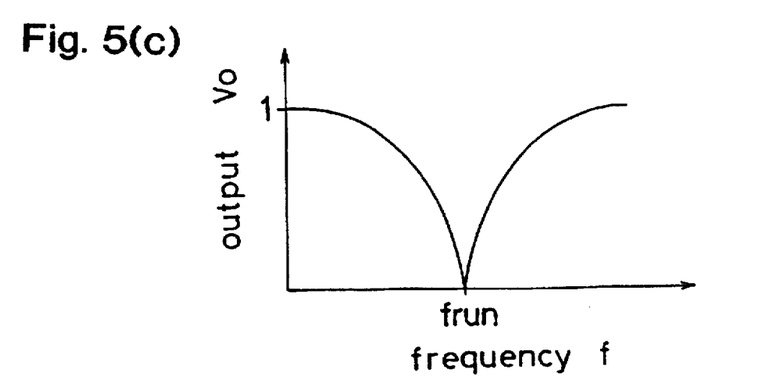

In the formula (4), when $\omega = \omega_o$ and Vo/Vi=0, the output Vo is equal to 0. When fo=$\omega_o$/2 is set to $f_{run}$ in the formula (4), the output Vo is equal to 0 at the input frequency of as shown in FIG. 5(c), which means that the damping is too large. Therefore, the respective constant values are shifted a little from the above-described relations, i.e., R1=R2=R, R3=R/2, C1=C2=C, and C3=2C, whereby the filter characteristic shown in FIG. 2(a) is obtained. To be specific, for example, C3 is made smaller than 2C to increase the high frequency permeability of the low-pass filter comprising R1, R2, and C3, and R3 is made larger than R/2 to increase the low frequency permeability of the high-pass filter. In this way, each constant value is determined. In a practical design, each constant value is set to an optimum value by a circuit simulation on the basis of the above-described guideline, considering conditions in the design process.

According to the first and second embodiments of the present invention, since a filter having the band-rejection characteristic shown in FIG. 2(a) is included in the input buffer circuit of the prescaler, the input sensitivity characteristics shown in FIG. 3(a) are obtained, and a reduction in the maximum input sensitivity is avoided and deterioration in the minimum input sensitivity is suppressed. As the result, the prescaler operates with input signals within a wide and constant range in a wide frequency region, whereby the input sensitivity of the prescaler IC is improved. In addition, since the filter included in the input buffer circuit comprises passive elements, power consumption in the input buffer circuit is reduced. In addition, a specific circuit structure of the filter is achieved by resistors and capacitors without using inductors, so that the size of the IC chip is reduced.

Figure 6A:
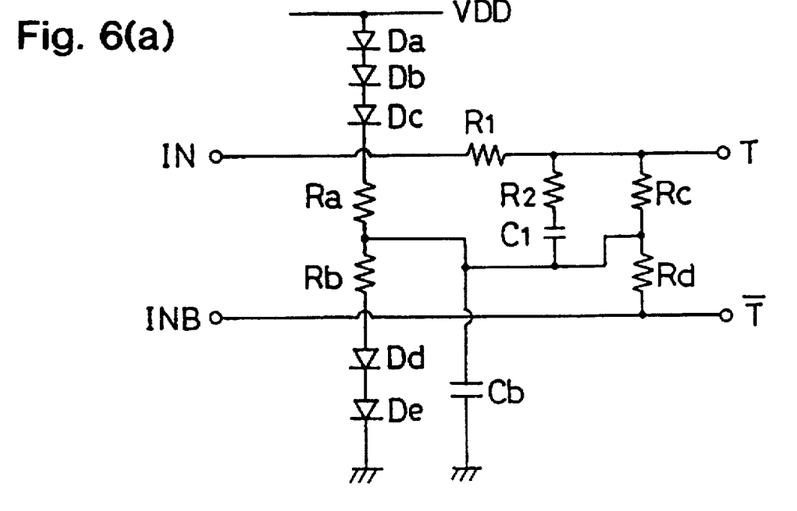
FIGS. 6(a)–6(c) are diagrams illustrating an input buffer circuit including a lag lead filter with the low-pass characteristic of FIG. 2(b)
Figure 6B:
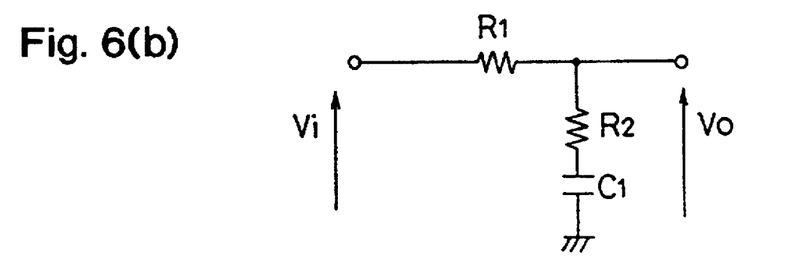
Figure 6C:
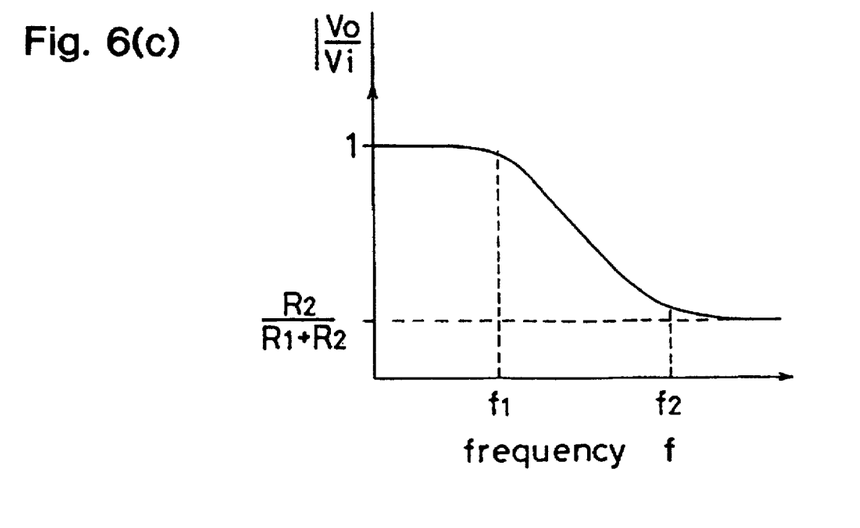

FIG. 6(a)–6(c) are diagrams illustrating an input buffer circuit of a frequency divider in accordance with a third embodiment of the present invention. In this third embodiment, a lag lead filter having the low-pass characteristic shown in FIG. 2(b) is included in the input buffer circuit. The lag lead filter comprises resistors R1 and R2 and a capacitor C1.

When the 3 dB cut-off frequency of the lag lead filter is set in the vicinity of the self-running oscillation frequency $f_{run}$ and the amount of the damping 20log10 R1/(R1+R2) at the frequency f=∞ is set higher than the 3 dB damping while considering the operation frequency of the prescaler, the amount of damping in the high frequency region can be restricted to 20log10 R1/(R1+R2)–3 dB, whereby the maximum input sensitivity level is increased and deterioration in the minimum input sensitivity is suppressed. Thus, the input sensitivity characteristics shown in FIG. 3(b) are obtained.

In FIG. 3(b), the maximum input sensitivity level is higher than that of FIG. 3(a) because the input amplitude limiting property in the high frequency region is superior to that of FIG. 3(a). However, the minimum input sensitivity is a little poorer than that of FIG. 3(a).

A description is given of a method of determining the value of the resistors R1 and R2 and the capacitor C1 of the lag lead filter included in the input buffer circuit of FIG. 6(a). FIG. 6(b) illustrates an AC equivalent circuit of the lag lead filter. The capacitor Cb is AC grounded and resistors Ra, Rb, Rc, and Rd shown in FIG. 6(a) are omitted in FIG. 6(b) because these resistors are significantly larger than other resistors.

The relation between an input Vi and an output Vo shown in FIG. 6(b) is represented as follows.

$$\frac{Vo}{Vi} = \frac{1 + j\omega C1 \, R2}{1 + j\omega C1(R1 + R2)} \quad (5)$$

A frequency fc, at which the amplitude of Vo becomes $1/\sqrt{2}$ of the amplitude of Vi, is represented as follows.

$$fc = \frac{1}{2\pi C1 R2 \sqrt{\left[1 + \frac{R1}{R2}\right]^2 - 1}} \quad (6)$$

However, when $f \to \infty$, R2/(R1+R2) in the formula (5) is;

$$R2/(R1+R2) < 1/\sqrt{2} \quad (7)$$

Accordingly, when values of R1, R2, and C1 are set so that the frequency fc are approximately equal to or lower than $F_{run}$ and satisfy the formula (7), the filter characteristic shown in FIG. 2(b) is obtained.

Alternatively, the characteristic of the formula (5) becomes as shown in FIG. 6(c) and corner frequencies f1 and f2 in FIG. 6(c) are;

$$\begin{cases} f1 = \frac{1}{2\pi C1(R1 + R2)} \\ f2 = \frac{1}{2\pi C1 \, R1} \end{cases}$$

Therefore, when values of R1, R2, and C1 are set so that f2 is approximately equal to $f_{run}$ and f1 is lower than f2, the filter characteristic shown in FIG. 2(b) is obtained.

According to the third embodiment of the present invention, since a filter having the low-pass characteristic shown in FIG. 2(b) is included in the input buffer circuit of the prescaler, the input sensitivity characteristics shown in FIG. 3(b) are obtained, and a reduction in the maximum input sensitivity is avoided and deterioration in the minimum input sensitivity is suppressed. As the result, the prescaler operates with input signals within a wide and constant range in a wide frequency region, whereby the input sensitivity of the prescaler IC is improved. In addition, since the filter included in the input buffer circuit comprises passive elements, power consumption in the input buffer circuit is suppressed. In addition, the specific circuit structure of the filter is achieved by resistors and capacitors without using inductors, so that the size of the IC chip is reduced.

Figure 7A:
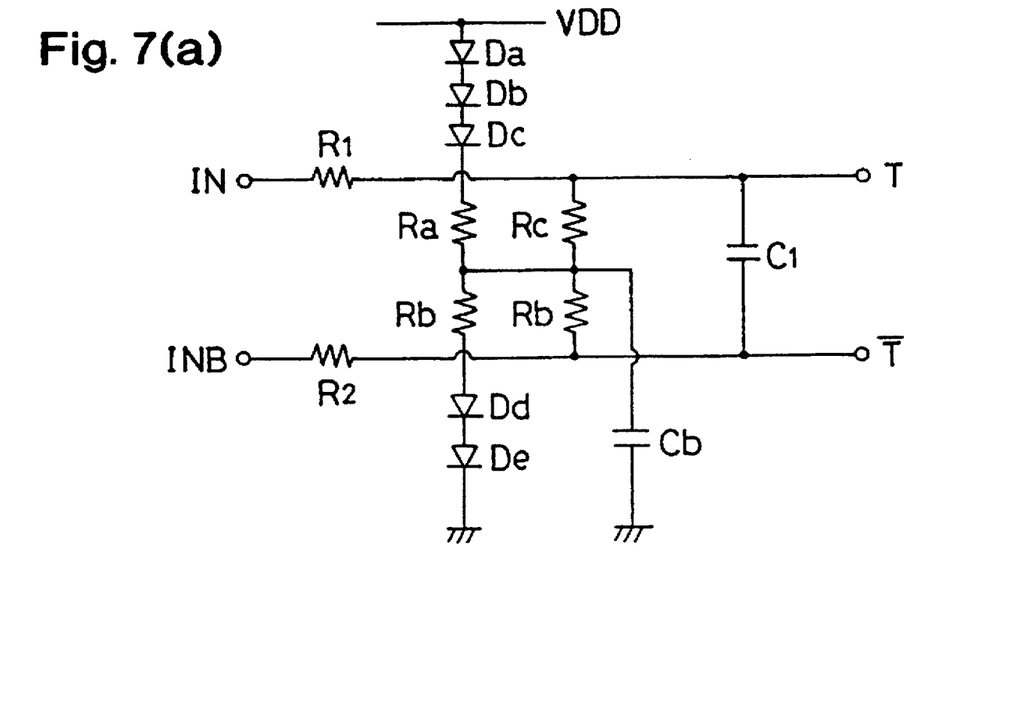
FIGS. 7(a) and 7(b) are diagrams illustrating an input buffer circuit including a low-pass filter with the low-pass characteristic of FIG. 2(c)
Figure 8A:
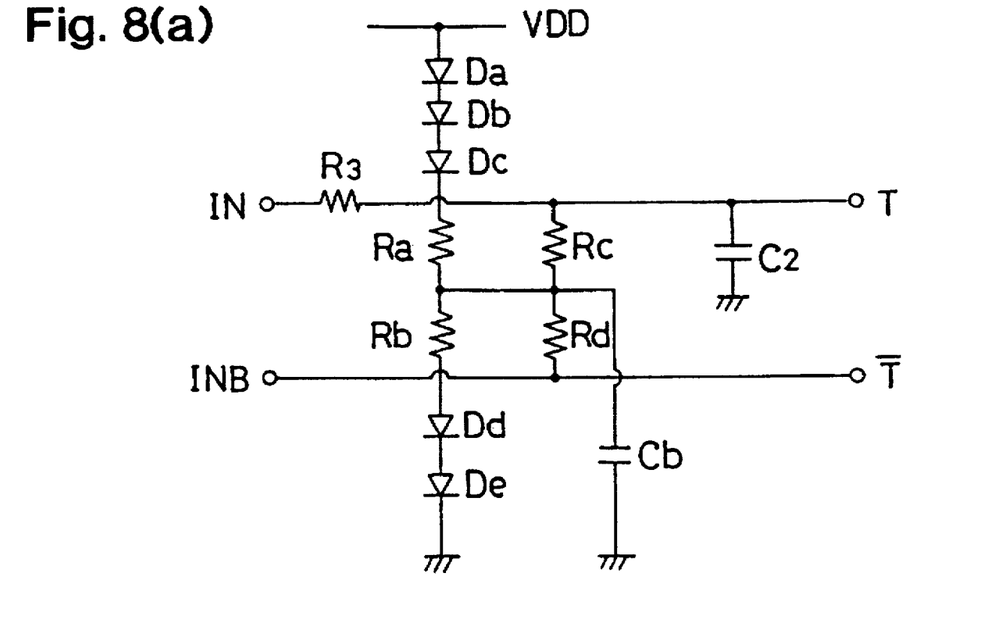
FIGS. 8(a) and 8(b) are diagrams illustrating another input buffer circuit including a low-pass filter with the low-pass characteristic of FIG. 2(c)

FIGS. 7(a) and 8(a) are diagrams illustrating input buffer circuits included in frequency dividers in accordance with the fourth and fifth embodiments of the present invention, respectively. In both embodiments, a low-pass filter comprising resistors and capacitors and having the low frequency pass characteristic shown in FIG. 2(c) is included in the input buffer circuit. In FIG. 7(a), the low-pass filter comprises resistors R1 and R2 and a capacitor C1. In FIG. 8(a), the low-pass filter comprises a resistor R3 and a capacitor C2.

When a 3 dB cut-off frequency of the low-pass filter is set in the vicinity of the self-running oscillation frequency $f_{run}$ while considering the operation frequency band of the prescaler, a reduction in the maximum input sensitivity in the high frequency region is avoided although the minimum input sensitivity in the high frequency region is a little poorer than those in the first to third embodiments. Thus, the input sensitivity characteristics shown in FIG. 3(b) are obtained. In FIG. 3(c), the minimum input sensitivity in the high frequency region is poorer than that of FIG. 3(b) because the input amplitude limiting property in the high frequency region is superior to that of FIG. 3(b).

A description is given of a method of determining constant values of the resistors R1 and R2 and the capacitor C1 of the low-pass filter shown in FIG. 7(a) and constant values of the resistor R3 and the capacitor C2 of the low-pass filter shown in FIG. 8(a).

Figure 7B:
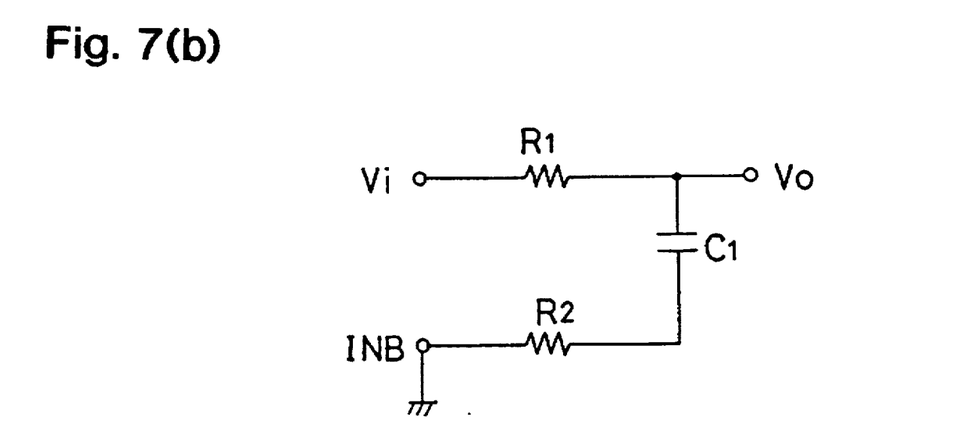
Figure 8B:
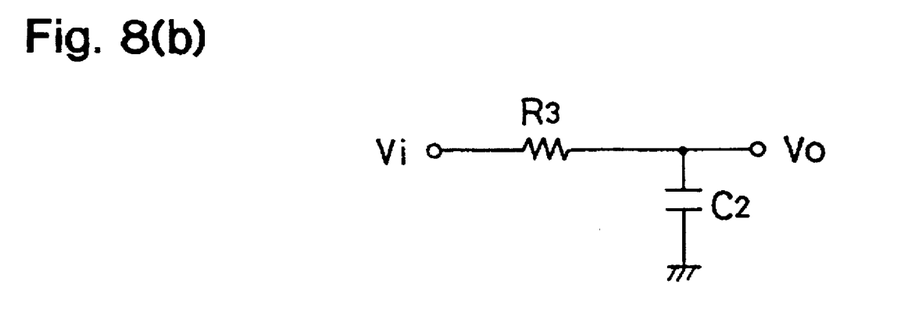

FIGS. 7(b) and 8(b) illustrate AC equivalent circuits of the filters of FIGS. 7(a) and 8(a), respectively. In FIG. 7(b), a reference INB is AC grounded by a large capacitor.

The 3 dB cut-off frequency fc of the low-pass filter shown in FIG. 7(b) is represented as follows.

$$fc = \frac{1}{2\pi \sqrt{C1(R1 + R2)}} \quad (9)$$

The 3 dB cut-off frequency fc of the low-pass filter shown in FIG. 8(b) is represented as follows.

$$fc = \frac{1}{2\pi \sqrt{C2 \, R3}} \quad (10)$$

Accordingly, the constant values of R1, R2, and C1 and the constant values of R3 and C2 are set so that fc in the formulae (9) or (10) may be approximately equal to or a little lower than $f_{run}$, and the filter characteristic shown in FIG. 2(c) is obtained.

According to the fourth and fifth embodiments of the present invention, since a filter having the low-pass characteristic shown in FIG. 2(c) is included in the input buffer circuit of the prescaler, the input sensitivity characteristics shown in FIG. 3(c) are obtained, a reduction in the maximum input sensitivity is avoided, and deterioration in the minimum input sensitivity is suppressed. As the result, the prescaler operates with input signals within a wide and constant range in a wide frequency region, whereby the input sensitivity of the prescaler IC is improved. In addition, since the filter included in the input buffer circuit comprises passive elements, power consumption in the input buffer circuit is suppressed. In addition, a specific circuit structure of the filter is achieved by resistors and capacitors without using inductors, so that the size of the IC chip is reduced.

Figure 9:
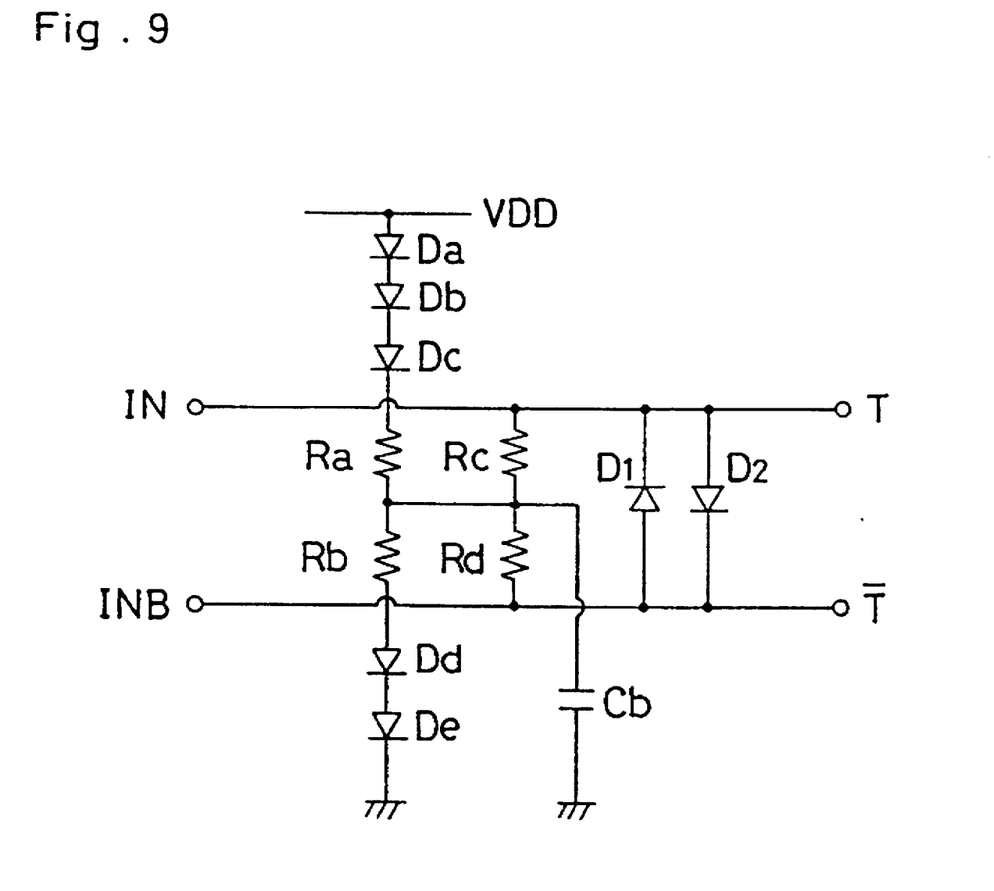
FIG. 9 is a diagram illustrating an input buffer circuit including a diode limiter.

FIG. 9 is a diagram illustrating an input buffer circuit of a frequency divider in accordance with a sixth embodiment of the present invention. In this sixth embodiment, the amplitude limiting means of the input buffer is achieved not by a filter but by a diode limiter. The diode limiter comprises diodes D1 and D2. In this structure, the input signal level is limited by the input voltage amplitude limiting function of the diode limiter and then it is input to the internal circuit.

In this case, although the prescaler shows a slight low-pass characteristic due to the junction capacitance of the diode, a constant amplitude limiting function is obtained in the operating frequency band of the prescaler, and the input sensitivity characteristics shown in FIG. 3(b) or 3(c) are obtained.

According to the sixth embodiment of the present invention, since the diode limiter is included in the input buffer circuit of the prescaler, the input sensitivity characteristics shown in FIG. 3(b) or 3(c) are obtained, a reduction in the maximum input sensitivity is avoided, and deterioration in the minimum input sensitivity is suppressed. As the result, the prescaler operates with input signals within a wide and constant range in a wide frequency region, whereby the input sensitivity of the prescaler IC is improved. In addition, since the amplitude limiting means is implemented by the diode limiter, power consumption in the input buffer circuit is suppressed. In addition, a specific circuit structure of the filter is achieved by resistors and capacitors without using inductors, so that the size of the IC chip is reduced.

Although the frequency dividers described in the first to sixth embodiments are the prescalers, the frequency divider of the present invention is not restricted thereto.

As is evident from the foregoing description, according to the present invention, a frequency divider comprises an input stage receiving an input signal, a divider stage for dividing the input signal received from the input stage, and an amplitude limiting circuit in the input stage. The amplitude limiting circuit limits the voltage amplitude of the signal input to the divider stage in a prescribed frequency region within an operating frequency region of the divider stage. Therefore, the input sensitivity of the divider circuit is improved.

What is claimed is:

1. An input buffer circuit for a frequency divider comprising:

a bias circuit including a first plurality of diodes connected in series, the series-connected first plurality of diodes having first and second end terminals, the first end terminal being connected to a power supply voltage terminal, at least first and second resistors connected in series to each other at a first junction, the series-connected first and second resistors having third and fourth end terminals, the third end terminal being connected to the second end terminal, and a second plurality of diodes connected in series, the second plurality of diodes having fifth and sixth end terminals, the fifth end terminal being connected to the fourth end terminal, and the sixth end terminal being connected to a ground;

an input signal terminal for receiving an input signal to be supplied to a frequency divider;

a reference input terminal for receiving a reference signal;

an output signal terminal;

a reference output terminal connected to the reference input terminal;

an analog filter connected between the input signal, reference input, and reference output terminals, the analog filter having a 3 dB cut-off frequency approximately equal to a self-running oscillation frequency of a frequency divider to which signals at the output signal and reference output signal terminals are supplied;

third and fourth resistors connected in series to each other at a second junction, the series-connected third and fourth resistors having seventh and eighth end terminals, the seventh end terminal being connected to the output signal terminal and the eighth end terminal being connected to the reference output terminal, the first and second junctions being connected together; and a capacitor connecting the first and second junctions to ground.

2. The input buffer circuit of claim 1 wherein the analog filter is a lag lead filter.

3. The input buffer circuit of claim 1 wherein the analog filter is a low-pass filter.

4. The input buffer circuit of claim 3 wherein the low pass filter consists of resistors and capacitors.

5. The input buffer circuit of claim 2 wherein the laglead filter consists of resistors and capacitors.

6. An input buffer circuit for a frequency divider comprising:

a bias circuit including a first plurality of diodes connected in series, the series-connected first plurality of diodes having first and second end terminals, the first end terminal being connected to a power supply voltage terminal, at least first and second resistors connected in series to each other at a first junction, the series-connected first and second resistors having third and fourth end terminals, the third end terminal being connected to the second end terminal, and a second plurality of diodes connected in series, the second plurality of diodes having fifth and sixth end terminals, the fifth end terminal being connected to the fourth end terminal, and the sixth end terminal being connected to a ground;

an input signal terminal for receiving an input signal to be supplied to a frequency divider;

a reference input terminal for receiving a reference signal;

an output signal terminal;

a reference output terminal connected to the reference input terminal;

a diode limiter connected between the output signal terminal and the reference output terminal;

third and fourth resistors connected in series to each other at a second junction, the series-connected third and fourth resistors having seventh and eighth end terminals, the seventh end terminal being connected to the output signal terminal and the eighth end terminal being connected to the reference output terminal, the first and second junctions being connected together; and a capacitor connecting the first and second junctions to ground.

7. An input buffer circuit for a frequency divider comprising:

a bias circuit including a first plurality of diodes connected in series, the series-connected first plurality of diodes having first and second end terminals, the first end terminal being connected to a power supply voltage terminal, at least first and second resistors connected in series to each other at a first junction, the series-connected first and second resistors having third and fourth end terminals, the third end terminal being connected to the second end terminal, and a second plurality of diodes connected in series, the second plurality of diodes having fifth and sixth end terminals, the fifth end terminal being connected to the fourth end terminal, and the sixth end terminal being connected to a ground;

an input signal terminal for receiving an input signal to be supplied to a frequency divider;

a reference input terminal for receiving a reference signal;

an output signal terminal;

a reference output terminal connected to the reference input terminal;

an analog filter connected between the input signal, reference input, output signal, and reference output terminals, the analog filter having a center frequency approximately equal to a self-running oscillation frequency of a frequency divider to which signals at the output signal and reference output terminals are supplied;

third and fourth resistors connected in series to each other at a second junction, the series-connected third and fourth resistors having seventh and eighth end terminals, the seventh end terminal being connected to the output signal terminal and the eighth end terminal being connected to the reference output terminal, the first and second junctions being connected together; and a capacitor connecting the first and second junctions to ground.

8. The input buffer circuit of claim 7 wherein the analog filter is a band-rejection filter.

9. The input buffer circuit of claim 8 wherein the band-rejection filter consists of resistors and capacitors.

10. The input buffer circuit of claim 7 wherein the analog filter is a notch filter.

11. The input buffer circuit of claim 10 wherein the notch filter consists of resistors and capacitors.

* * * * *